United States Patent
Huang et al.

(10) Patent No.: US 7,934,176 B2
(45) Date of Patent: Apr. 26, 2011

(54) METHOD AND APPARATUS FOR DETERMINING A PROCESS MODEL THAT MODELS THE IMPACT OF A CAR/PEB ON THE RESIST PROFILE

(75) Inventors: Jensheng Huang, San Jose, CA (US); Chun-chieh Kuo, Hsinchu (TW); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/774,522

(22) Filed: May 5, 2010

(65) Prior Publication Data

US 2010/0218160 A1    Aug. 26, 2010

Related U.S. Application Data

(62) Division of application No. 11/800,917, filed on May 7, 2007, now Pat. No. 7,743,357.

(51) Int. Cl.
*G06F 17/50* (2006.01)
(52) U.S. Cl. ......................................................... 716/54
(58) Field of Classification Search ...................... 716/54
See application file for complete search history.

(56) References Cited

U.S. PATENT DOCUMENTS

| | | | | |
|---|---|---|---|---|
| 6,673,638 B1* | 1/2004 | Bendik et al. | ............. | 438/14 |
| 6,777,147 B1* | 8/2004 | Fonseca et al. | .............. | 430/30 |
| 7,016,017 B2* | 3/2006 | Hansen | .............. | 355/67 |
| 7,117,475 B2* | 10/2006 | Croffie | .............. | 716/53 |
| 7,243,332 B2* | 7/2007 | Melvin et al. | .............. | 716/51 |
| 7,352,451 B2* | 4/2008 | Levinski et al. | .............. | 356/123 |
| 7,494,753 B2* | 2/2009 | Chen et al. | .............. | 430/30 |
| 7,743,357 B2* | 6/2010 | Huang et al. | .............. | 716/50 |
| 2002/0161527 A1 | 10/2002 | Inui | | |

FOREIGN PATENT DOCUMENTS

| EP | 1688795 A2 | 8/2006 |
|---|---|---|
| EP | 1696269 A2 | 8/2006 |
| GB | 2320768 A | 12/1997 |

OTHER PUBLICATIONS

Chang-Nam Ahn, et al., "A Novel Approximate Model for Resist Process", Semiconductor Research Div., Hyundai Electronics Industries Co., Ltd., XP 008001839, SPIE vol. 3334, pp. 752-763, 1998.

* cited by examiner

*Primary Examiner* — Vuthe Siek
*Assistant Examiner* — Brandon W Bowers
(74) *Attorney, Agent, or Firm* — Park, Vaughn, Fleming & Dowler LLP; Laxman Sahasrabuddhe (57) ABSTRACT

An embodiment provides systems and techniques for determining a process model. During operation, the system may receive a first optical model which models a first optical system of a photolithography process. Next, the system may use the first optical model to determine a second optical model that models a second latent image that is formed by the first optical system at a second distance. The system may also use the first optical model to determine a third optical model that models a third latent image that is formed by the first optical system at a third distance. Next, the system may receive process data which is obtained by subjecting a test layout to the photolithography process. The system may then determine a process model using the first optical model, the second optical model, the third optical model, the test layout, and the process data.

21 Claims, 5 Drawing Sheets

METHOD AND APPARATUS FOR DETERMINING A PROCESS MODEL THAT MODELS THE IMPACT OF A CAR/PEB ON THE RESIST PROFILE

RELATED APPLICATION

This application is a divisional application of, and claims priority to, U.S. patent application Ser. No. 11/800,917, by inventors Jensheng Huang, Chun-chieh Kuo, and Lawrence S. Melvin III, entitled "METHOD AND APPARATUS FOR DETERMINING A PROCESS MODEL THAT MODELS THE IMPACT OF CAR/PEB ON THE RESIST PROFILE, filed on 7 May 2007.

BACKGROUND

1. Field of the Invention

The present invention relates to integrated circuit design and fabrication. More specifically, the present invention relates to a method and an apparatus to determine a photolithography process model that models the impact of CAR/PEB (Chemically Amplified Resist Post Exposure Bake) on the resist profile.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

As semiconductor design enters the deep submicron era, process model accuracy is becoming increasingly important. Inaccuracies in the process model negatively affect the efficacy of downstream applications. For example, inaccuracies in the photolithography process model can reduce the efficacy of optical proximity correction (OPC). Hence, it is desirable to improve process model accuracy.

SUMMARY

One embodiment of the present invention provides systems and techniques for determining an accurate process model. A process model usually needs to be very fast and accurate, and hence, insignificant physical effects are often ignored during modeling to improve simulation performance. However, as semiconductor integration densities continue to increase at exponential rates, a number of physical effects that were ignored in the past can no longer be ignored.

One factor that is typically ignored in conventional techniques, but which is becoming increasingly significant, is the printed resist profile in the Z direction. The printed resist profile in the Z direction can have a slope due to the diffusion of acids in the photoresist and/or due to the fact that the printed features are below the exposure resolution limit. The characteristics of the printed resist profile in the Z direction can affect the behavior of subsequent processes, such as etch.

An embodiment models the effect of CAR/PEB on the printed resist profile in the Z direction. Specifically, the embodiment can model a defocused aerial image at a distance that is different from the best focus distance to account for the aerial image signal difference between photoresist depths, and diffuses the aerial image using a Gaussian kernel to account for the diffusion length difference between the Z direction and the X/Y directions.

DETAILED DESCRIPTION

Integrated Circuit (IC) Design Flow

Figure 1:
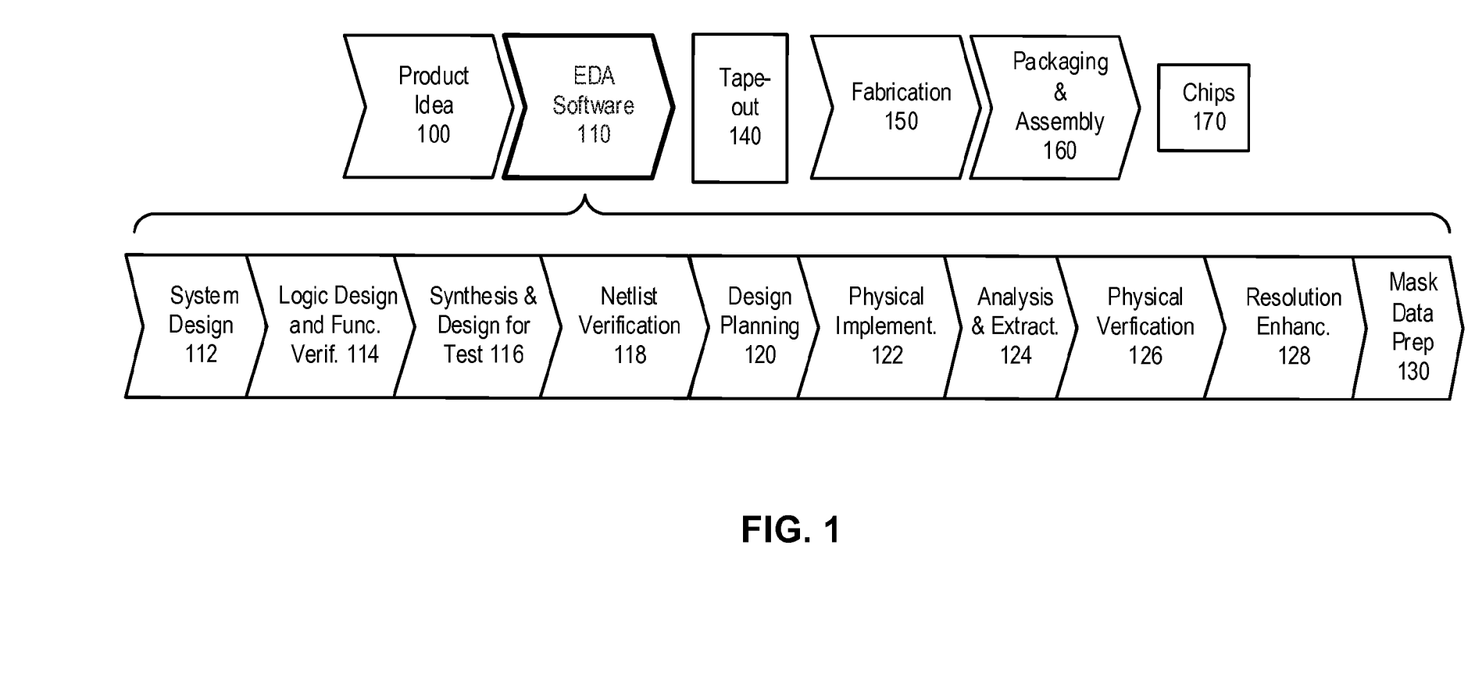
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the conception of the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda® products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this step, the circuit function is verified at a transistor level, this in turn permits what-if refinement. Exemplary EDA software products from Synopsys, Inc. that can be used at this step include AstroRail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the resolution enhancement step 128.

Process Model

A process model models the behavior of one or more semiconductor manufacturing processes which typically involve complex physical and chemical interactions. A process model is usually determined by fitting kernel coefficients to empirical data. The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of features on the resulting wafer before and/or after the etch process. The process model can then be fit to the empirical data to determine a process model that models the photolithography process.

Once a process model is determined, it can be used in a number of applications during the design and manufacture of a semiconductor chip. For example, process models are typically used to support Optical Proximity Correction (OPC) and Resolution Enhancement Techniques (RET). These models can allow full-chip database manipulation in reasonable timeframes during the tapeout flow.

A process model can include functions or kernels that are associated with parameters and/or coefficients which are statistically fit to empirical data. A function or a kernel can be any mathematical expression.

For example, a process model may be represented as $$\sum_i (C_i \cdot K_i),$$

associated with $K_i$. The empirical data may include values of a desired property, e.g., the CD, at different locations in the layout. Once the process model is fit to the empirical data, it can then be used to predict the value of the desired property for other layouts.

Ideally, we may want to determine coefficient values which will cause the predicted data to exactly match the empirical data. However, an exact fit is usually not possible, and even if it is possible, it may not be desirable because the resulting process model may not interpolate and/or extrapolate properly. Hence, statistical fitting techniques are typically used to determine the parameters and/or coefficients so that the error between the empirical data and the predicted data is minimized. In one embodiment, the system can use a least-squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Model

The optical model in a photolithography process model is usually based on the Hopkins model which uses the principles of optics to model the behavior of partially coherent optical systems.

Figure 2:
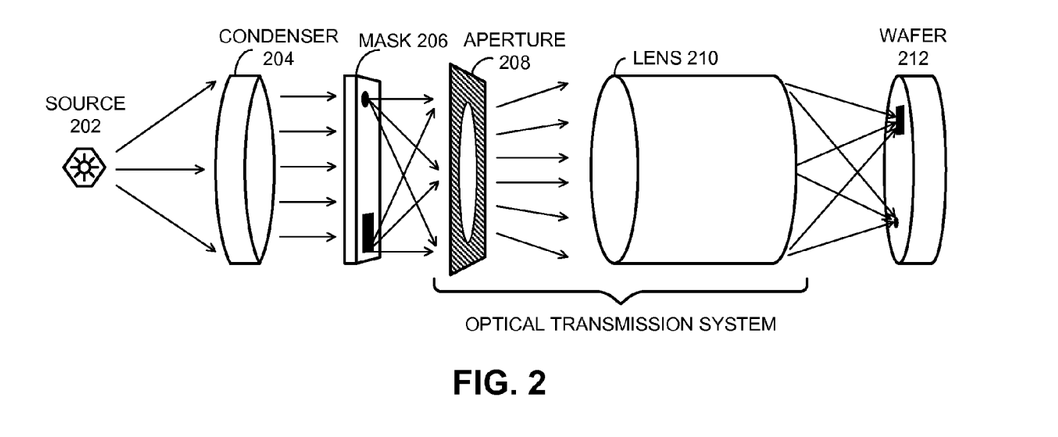
FIG. 2 illustrates a typical optical system in accordance with an embodiment of the present invention.

FIG. 2 illustrates a typical optical system in accordance with an embodiment of the present invention.

Radiation from source 202 can be collimated by a condenser 204. The collimated light can then pass through mask 206, aperture 208, lens body 210, and form an image on a wafer 212.

Specifically, the Hopkins model can be described using the expression:

$$I(x,y) = \iiiint J(x',y';x'',y'') \otimes L(x,y;x',y') \otimes L^*(x,y;x'',y'') \, dx'dy'dx''dy'',$$

where, $I(x, y)$ is the optical intensity at point $(x, y)$ on the wafer, $L(x, y; x', y')$ is a lumped model of the light source and the mask, $L^*$ is the complex conjugate of L, and $J(x', y'; x'', y'')$ models the incoherence between two points of light on the mask. The lumped model (L) essentially treats the mask as an array of light sources. In particular, $L(x, y; x', y')$ models point $(x', y')$ on the mask as a point source, and $J(x', y'; x'', y'')$ models the incoherence between the light emanating from points $(x', y')$ and $(x'', y'')$ on the mask. The lumped model (L) can be represented as a convolution between the mask and the source. For example, the lumped model can be represented using a mask model and a source model as follows:

$$L(x,y;x',y') = M(x',y') \otimes K(x,y;x',y'),$$

where M(x', y') models the mask and K(x, y; x', y') models the source.

The Hopkins model can be used to determine a 4-D (four dimensional) matrix called the Transmission Cross Coefficient (TCC) matrix which models the optical system. The TCC matrix can then be represented using a set of orthogonal 2-D (two dimensional) kernels. Specifically, the set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics, $2^{nd}$ Edition*, Dover Publications, 1989.

In one embodiment, the system uses Zernike polynomials, which are a set of orthogonal functions, to represent the optical system. Zernike polynomials are made up of terms that are of the same form as the types of aberrations often observed in optical systems. For example, one Zernike polynomial may be associated with defocus, while another may be associated with tilt, etc. Zernike polynomials are usually represented in polar coordinates. Specifically, the optical system can be represented using the expression $$\sum_i (C_i \cdot Z_i),$$

where $Z_i$ is a Zernike polynomial and $C_i$ is an optical coefficient which is associated with $Z_i$.

Chemically Amplified Resist Post Exposure Bake Effects

A process model usually needs to be very fast and accurate. As such, "small" physical effects are often ignored during modeling to increase simulation speed. However, the physical effects that are "small" at one process node may become significant at another process node. One such effect that was often ignored in the past, but which is becoming increasingly significant, is the Z direction diffusion of acids in the photoresist. At the 45 nm process node this physical effect may cause process model errors of 5% or greater, and hence this effect needs to be modeled in the process model without sacrificing computational performance.

In addition to accuracy and performance, the Time To Accurate Model (TTAM) is another important property of a process model. The TTAM is the amount of time it takes to determine an acceptably accurate process model by fitting an uncalibrated process model to process data. Obviously, a low TTAM value is desirable.

Chemicaly Amplified Resist Post Exposure Bake (CAR/PEB) effects have grown more significant at the 45 nm and 32 nm process nodes for Optical Proximity Correction (OPC) model calibration. In conventional approaches, CAR/PEB effects are modeled using reaction diffusion kinetics of chemically amplified resist during post exposure bake processes. However, these conventional approaches are impractical for OPC modeling applications because they are too slow since they require the system to solve nonlinear partial differential equations. Moreover, conventional approaches do not accurately model the printed resist profile in the Z direction because they use the aerial image intensity at a single latitude (or distance) or they use the average of the aerial image intensities over multiple latitudes.

An OPC model needs to account for CAR/PEB effects because the model needs to simulate the signal change from a measured line-width difference. For example, the resist profiles in the Z direction can be different for line/space patterns and line-ends. This difference in the resist profile can significantly affect the behavior of subsequent processes, e.g., the resist profile can affect the amount of etch bias. Hence, the model needs to simulate the aerial image signal difference (which corresponds to the diffusion length) between the Z direction and the X/Y directions.

Figure 8:
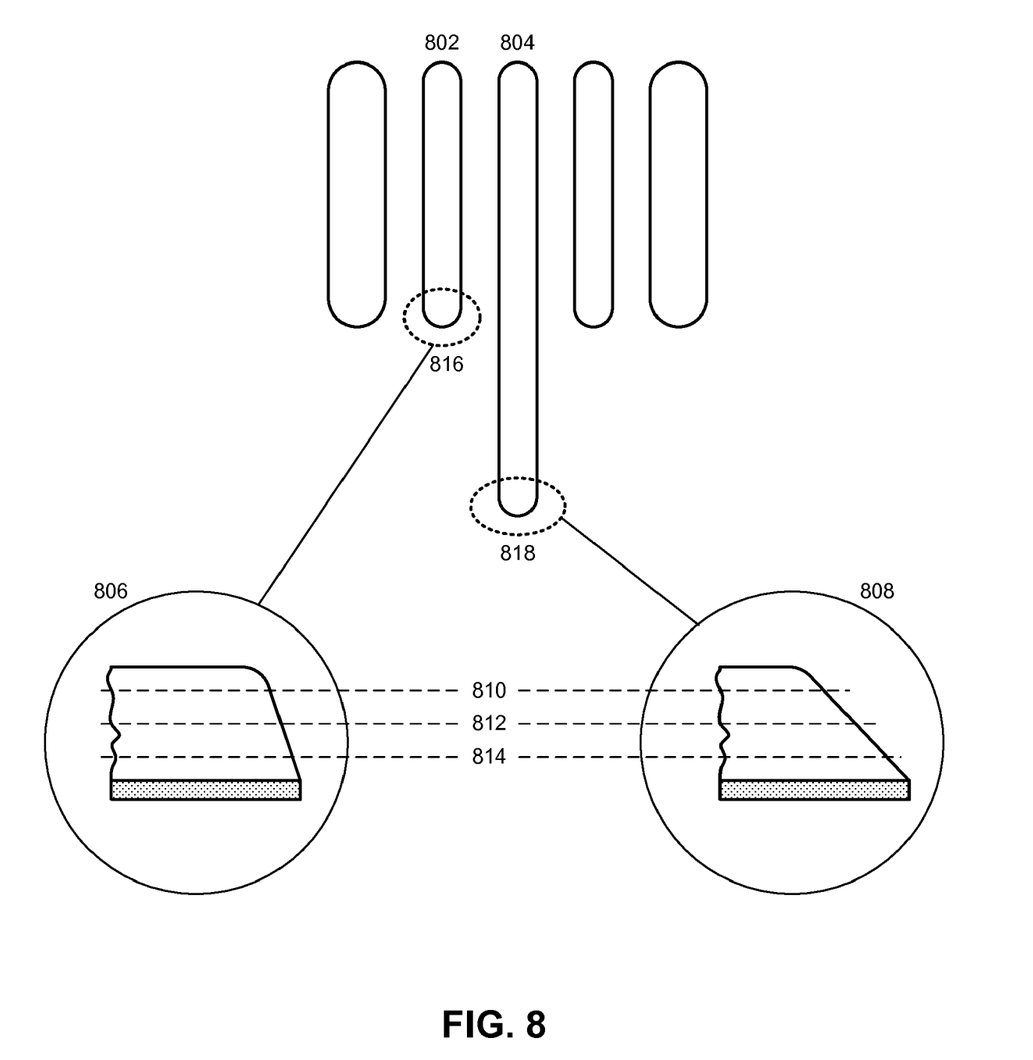
FIG. 8 illustrates a resist profile in the Z direction in accordance with an embodiment of the present invention.

FIG. 8 illustrates a resist profile in the Z direction in accordance with an embodiment of the present invention.

The resist pattern shown in FIG. 8 includes printed lines 802 and 804. Printed lines 802 and 804 are both part of a line and space pattern, but printed line 804 includes an isolated extension. Resist profile 806 represents the profile of region 816 in the Z direction. Resist profile 808 represents the profile of region 818 in the Z direction. Note that resist profile 806 is steeper than resist profile 808. One reason for the difference in the slopes of the resist profiles is the fact that the gradient-magnitude of the aerial image intensity in region 806 is greater than the gradient-magnitude of the aerial image intensity in region 808.

Conventional models model the aerial image at a fixed depth, e.g., nominal depth 812. Hence, conventional techniques cannot accurately model the difference between the resist profiles of isolated features (e.g., extension of printed line 804) and dense features (e.g., printed line 802). One embodiment of the present invention uses the aerial image at multiple latitudes (or depths) to model the resist profiles of isolated and dense features. For example, an embodiment can model the aerial image at depth 810 and 814. Next, the embodiment can use these aerial images to generate a photolithography process model that accurately models the effect of CAR/PEB on the resist profile and/or the effect of the gradient-magnitude of the aerial image on the resist profile.

One embodiment of the present invention provides systems and techniques for determining a process model that accurately models CAR/PEB effects without sacrificing runtime performance. An embodiment models a defocused aerial image at a distance with same defocus or different defocus value that can be different from the best focus distance to account for the aerial image signal difference between photoresist depths. Next, the embodiment diffuses the aerial image using a Gaussian kernel to account for the diffusion length difference between the Z direction and the X/Y directions.

A Photolithography Process Model that Models CAR/PEB Effects

Figure 3:
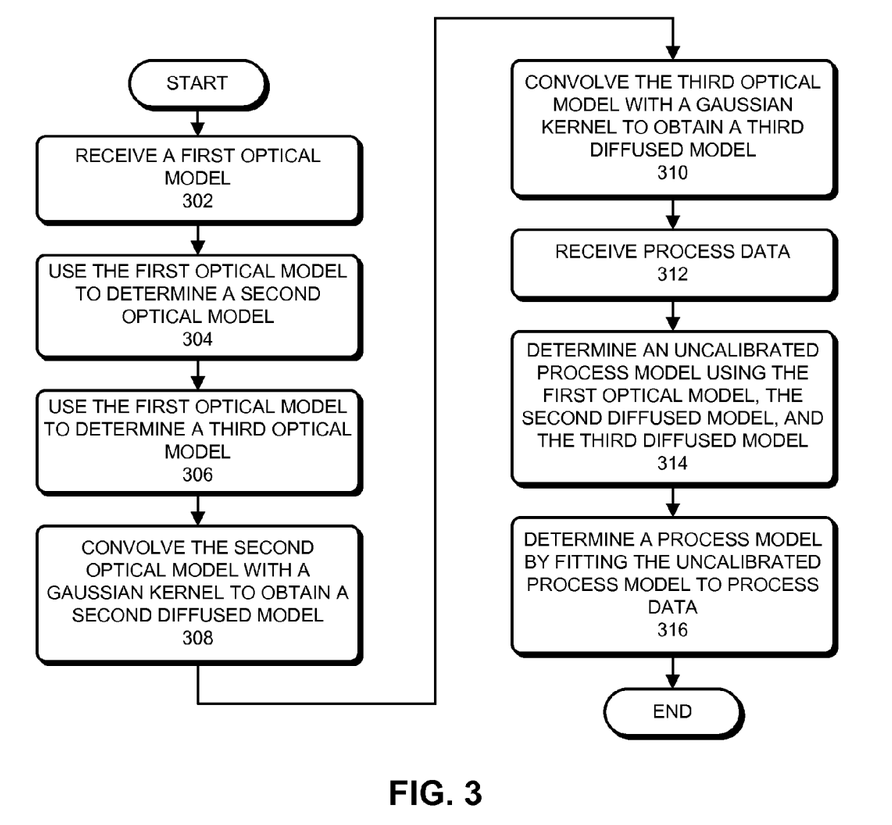
FIG. 3 presents a flow chart that illustrates a process for determining a process model that models the impact of CAR/PEB on the resist profile and/or the impact of the gradient-magnitude of the aerial image intensity in accordance with an embodiment of the present invention.

FIG. 3 presents a flow chart that illustrates a process for determining a process model that models the impact of CAR/PEB on the resist profile and/or the impact of the gradient-magnitude of the aerial image intensity in accordance with an embodiment of the present invention.

The process can begin by receiving a first optical model (stage 302) which models a first optical system of a photolithography process.

Next, the system can use the first optical model to determine a second optical model (stage 304). In one embodiment, the second optical model can model a second latent image that is formed by the first optical system at a second distance that is different from the first optical system's best focus distance. In another embodiment, the second optical model can model a second latent image that is formed by a second optical system at the first optical system's best focus distance. In yet another embodiment, the second optical model can model a second latent image that is formed by a second optical system at a second distance that is different from the first optical system's best focus distance.

The system can then use the first optical model to determine a third optical model (stage 306). In one embodiment, the third optical model can model a third latent image that is formed by the first optical system at a third distance that is different from the first optical system's best focus distance. In another embodiment, the third optical model can model a third latent image that is formed by a third optical system at the first optical system's best focus distance. In yet another embodiment, the third optical model can model a third latent image that is formed by a third optical system at a third distance that is different from the first optical system's best focus distance.

Note that the second distance, the third distance, and the first optical system's best focus distance can be different from one another. Further, note that the chemically amplified resist post exposure bake effects can be modeled using the second optical model and the third optical model.

Figure 4:
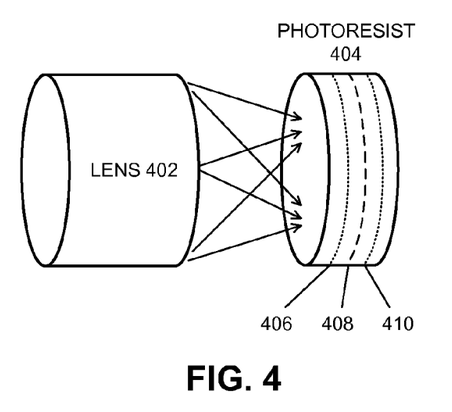
FIG. 4 illustrates how latent images can be formed at different distances in accordance with an embodiment of the present invention.

FIG. 4 illustrates how latent images can be formed at different distances in accordance with an embodiment of the present invention.

Lens 402 is part of an optical system of a photolithography process. The photolithography process uses lens 402 to image a mask layout on photoresist layer 404. (Note that photoresist layer 404 is not drawn to scale. The photoresist layer is typically very thin; however, it has been magnified in FIG. 404 for illustration purposes.)

The best focus distance of an optical system is defined by the location of the plane where we ideally want the mask layout to image. In FIG. 4, plane 408 is located at lens 402's best focus distance. Planes 406 and 410 are located at distances that are different from lens 402's best focus distance.

The second and third optical models model the latent images at distances that are different from the best focus distance. For example, the second optical model can model the latent image at plane 406, and the third optical model can model the latent image at plane 408.

Figure 5A:
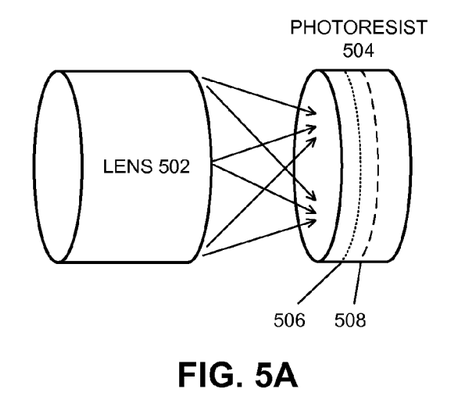
FIGS. 5A, 5B, and 5C illustrate how latent images can be formed on a plane by varying the focal length in accordance with an embodiment of the present invention.
Figure 5B:
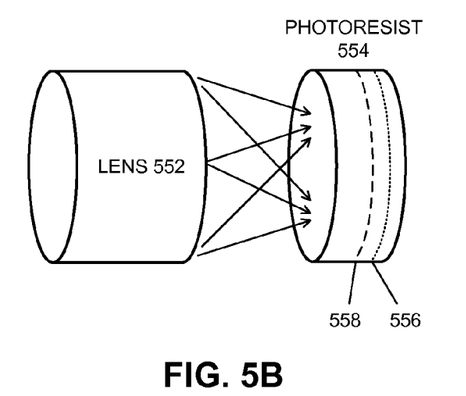
Figure 5C:
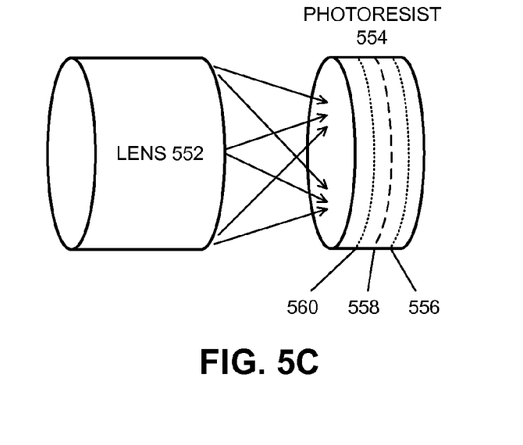

FIGS. 5A, 5B, and 5C illustrate how latent images can be formed on a plane by varying the focal length in accordance with an embodiment of the present invention.

In FIG. 5A, lens 502 is part of an optical system that is used by a photolithography process to generate an image on photoresist layer 504. Plane 508 is located at the best focus distance of lens 402 (shown in FIG. 4). Lens 502's focal length, however, is different from lens 402's focal length. Specifically, plane 506 is lens 502's best focus distance. Hence, the image formed at plane 508 is defocused. In one embodiment, the second optical model models the latent image formed by the lens (e.g., lens 502) of a second optical system at a plane (e.g., plane 508) that is located at the first optical system's best focus distance.

Similarly, in FIG. 5B, lens 552 is part of an optical system that is used by a photolithography process to generate an image on photoresist layer 554. Plane 558 is located at the best focus distance of lens 402 (shown in FIG. 4). Lens 552's focal length, however, is different from lens 402's focal length. Specifically, plane 556 is lens 552's best focus distance. Hence, the image formed at plane 558 is defocused. In one embodiment, the third optical model models the latent image formed by the lens (e.g., lens 552) of a third optical system at a plane (e.g., plane 558) that is located at the first optical system's best focus distance.

Note that the optical system's focal distance and the location of the image can be changed simultaneously. For example, in FIG. 5C, the third model can model the latent image formed by the lens (e.g., lens 552) of a third optical system at a plane (e.g., plane 560) that is located at a distance that is different from the third optical system's best focus distance.

The system can then determine a process model using the first optical model, the second optical model, the third optical model, a test layout, and process data associated with the test layout. In one embodiment, the system can first determine an uncalibrated process model using the first optical model, the second optical model, and the third optical model. Next, the system can fit the uncalibrated process model using the process data.

Specifically, the system can convolve the second optical model with a second Gaussian kernel to obtain a second diffused model (stage 308).

The system can also convolve the third optical model with a third Gaussian kernel to obtain a third diffused model (stage 310).

Next, the system can receive process data (stage 312) which is obtained by subjecting a test layout to the photolithography process.

The system can then determine an uncalibrated process model using the first optical model, the second diffused model, and the third diffused model (stage 314). Note that the system doesn't have to use both the second diffused model and the third diffused model. Specifically, in one embodiment, the system may determine an uncalibrated process model using the first model and the second model.

In one embodiment, the uncalibrated process model, $I_U$, is expressed as:

$$I_U = C_1 \cdot I_1 + C_2 \cdot (G_2 \otimes I_2) + C_3 \cdot (G_3 \otimes I_3), \quad (1)$$

where, $I_1, I_2, I_3$ are the first, second, and third optical models, respectively, $C_1, C_2, C_3$ are the first, second, and third coefficients, respectively, and $G_2, G_3$ are the second and third Gaussian kernels, respectively.

Next, the system can determine a process model by fitting the uncalibrated process model to the process data (stage 316).

Figure 6:
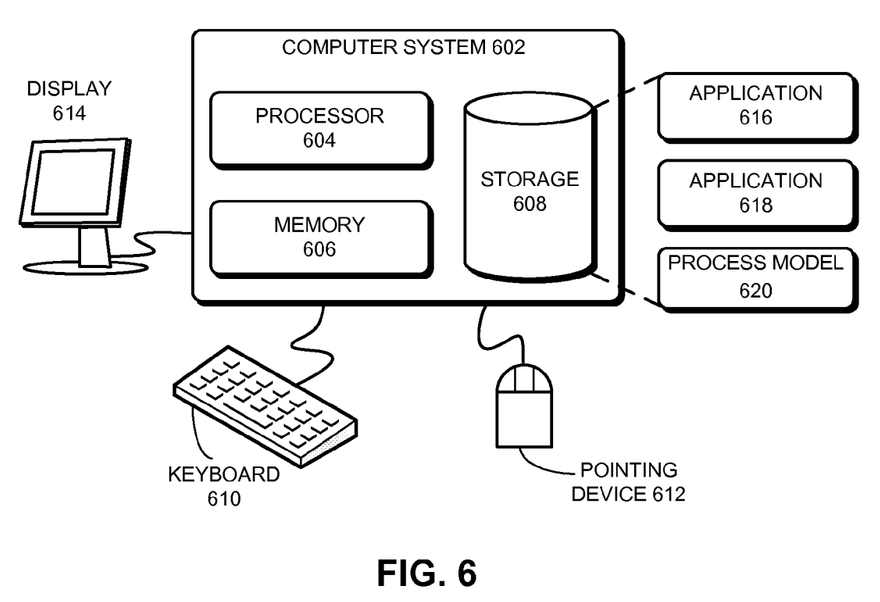
FIG. 6 illustrates how a system can determine and use a process model in accordance with an embodiment of the present invention.

FIG. 6 illustrates how a system can determine and use a process model in accordance with an embodiment of the present invention.

Computer system 602 comprises processor 604, memory 606, and storage device 608. Computer system 602 can be coupled to display 614, keyboard 610, and pointing device 612. Storage device 608 can store applications 616 and 618, and process model 620.

During operation, computer system 602 can load application 616 into memory 606. Next, the system can use application 616 to determine process model 620. Application 616 can then store process model 620 on storage device 608.

Note that the system can store a process model by storing the parameters and/or coefficients in a computer-readable storage medium. In one embodiment, the system may store parameters, coefficients, kernel identifiers, and information that associates the parameters and coefficients with their respective kernel identifiers. A kernel identifier can be a string that identifies a kernel, or it can be an expression that represents the kernel.

Next, the system can load application 618 into memory 606. Application 618 can then load process model 620 into memory 606, and use process model 620 to determine a proximity correction or to predict the shape of a pattern on a photoresist layer.

Figure 7:
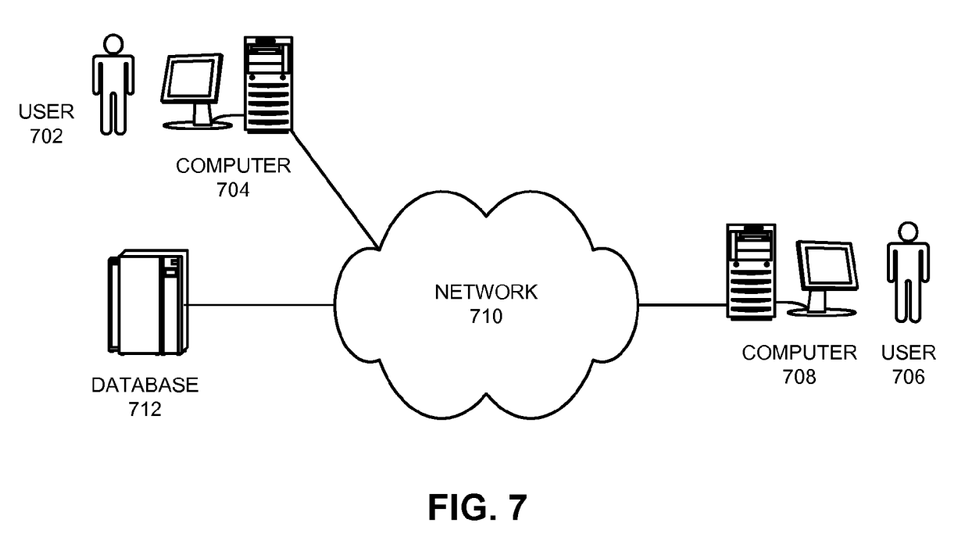
FIG. 7 illustrates how a process model can be stored in a computer-readable storage medium in accordance with an embodiment of the present invention.

FIG. 7 illustrates how a process model can be stored in a computer-readable storage medium in accordance with an embodiment of the present invention.

User 702 may use computer 704 to determine a process model. Next, user 702 may store the parameters, coefficients, kernel identifiers, and information that associates the parameters and coefficients to the kernel identifiers on computer 704's hard disk or a removable computer-readable storage medium. Alternatively, user 702 may store the process model on database 712 which is coupled to computer 704 via network 710. User 706 may receive the process model from user 702 over network 710. Alternatively, user 706 may retrieve the process model from database 712. User 706 can load the process model on computer 708 by reading the parameters, coefficients, kernel identifiers, and the information that associates the parameters and coefficients to the kernel identifiers.

Conclusion

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for determining a process model, the method comprising:
receiving a first optical model which models a first image that is formed by a first optical system of a photolithography process at the first optical system's best focus distance;
receiving a second optical model which models a second latent image that is formed by a second optical system at the first optical system's best focus distance;
receiving a third optical model which models a third latent image that is formed by a third optical system at the first optical system's best focus distance;
receiving process data which is obtained by subjecting a test layout to the photolithography process;
determining an uncalibrated process model using the first optical model, the second optical model, and the third optical model; and
fitting, by using a computer, the uncalibrated process model using the process data.

2. The method of claim 1, wherein the first optical system's best focus distance, the second optical system's best focus distance, and the third optical system's best focus distance are different from one another.

3. The method of claim 1, wherein chemically amplified resist post exposure bake effects are modeled using the second optical model and the third optical model.

4. The method of claim 1, wherein determining the uncalibrated process model includes:
convolving the second optical model with a second Gaussian kernel to obtain a second diffused model;
convolving the third optical model with a third Gaussian kernel to obtain a third diffused model; and
determining the uncalibrated process model by combining the first optical model, the second diffused model, and the third diffused model.

5. The method of claim 4, wherein combining the first optical model, the second diffused model, and the third diffused model involves determining a weighted sum of the first optical model, the second diffused model, and the third diffused model.

6. The method of claim 5, wherein fitting, by using a computer, the uncalibrated process model using the process data involves determining coefficients of the weighted sum of the first optical model, the second diffused model, and the third diffused model.

7. The method of claim 1, wherein the first optical model, the second optical model, and the third optical model are represented as weighted sums of Zernike polynomials.

8. A non-transitory computer-readable storage medium storing instructions that when executed by a computer cause the computer to perform a method for determining a process model, the method comprising:
receiving a first optical model which models a first image that is formed by a first optical system of a photolithography process at the first optical system's best focus distance;
receiving a second optical model which models a second latent image that is formed by a second optical system at the first optical system's best focus distance;
receiving a third optical model which models a third latent image that is formed by a third optical system at the first optical system's best focus distance;
receiving process data which is obtained by subjecting a test layout to the photolithography process;
determining an uncalibrated process model using the first optical model, the second optical model, and the third optical model; and
fitting the uncalibrated process model using the process data.

9. The non-transitory computer-readable storage medium of claim 8, wherein the first optical system's best focus distance, the second optical system's best focus distance, and the third optical system's best focus distance are different from one another.

10. The non-transitory computer-readable storage medium of claim 8, wherein chemically amplified resist post exposure bake effects are modeled using the second optical model and the third optical model.

11. The non-transitory computer-readable storage medium of claim 8, wherein determining the uncalibrated process model includes:
convolving the second optical model with a second Gaussian kernel to obtain a second diffused model;
convolving the third optical model with a third Gaussian kernel to obtain a third diffused model; and
determining the uncalibrated process model by combining the first optical model, the second diffused model, and the third diffused model.

12. The non-transitory computer-readable storage medium of claim 11, wherein combining the first optical model, the second diffused model, and the third diffused model involves determining a weighted sum of the first optical model, the second diffused model, and the third diffused model.

13. The non-transitory computer-readable storage medium of claim 12, wherein fitting the uncalibrated process model using the process data involves determining coefficients of the weighted sum of the first optical model, the second diffused model, and the third diffused model.

14. The non-transitory computer-readable storage medium of claim 8, wherein the first optical model, the second optical model, and the third optical model are represented as weighted sums of Zernike polynomials.

15. An apparatus for determining a process model, the apparatus comprising:
a computing mechanism configured to execute instructions stored in a storage device; and
the storage device storing instructions that when executed by the computing mechanism cause the apparatus to:
receive a first optical model which models a first image that is formed by a first optical system of a photolithography process at the first optical system's best focus distance;
receive a second optical model which models a second latent image that is formed by a second optical system at the first optical system's best focus distance;
receive a third optical model which models a third latent image that is formed by a third optical system at the first optical system's best focus distance;
receive process data which is obtained by subjecting a test layout to the photolithography process;
determine an uncalibrated process model using the first optical model, the second optical model, and the third optical model; and
fit the uncalibrated process model using the process data.

16. The apparatus of claim 15, wherein the first optical system's best focus distance, the second optical system's best focus distance, and the third optical system's best focus distance are different from one another.

17. The apparatus of claim 15, wherein chemically amplified resist post exposure bake effects are modeled using the second optical model and the third optical model.

18. The apparatus of claim 15, wherein determining the uncalibrated process model includes:
convolving the second optical model with a second Gaussian kernel to obtain a second diffused model;
convolving the third optical model with a third Gaussian kernel to obtain a third diffused model; and
determining the uncalibrated process model by combining the first optical model, the second diffused model, and the third diffused model.

19. The apparatus of claim 18, wherein combining the first optical model, the second diffused model, and the third diffused model involves determining a weighted sum of the first optical model, the second diffused model, and the third diffused model.

20. The apparatus of claim 19, wherein fitting the uncalibrated process model using the process data involves determining coefficients of the weighted sum of the first optical model, the second diffused model, and the third diffused model.

21. The apparatus of claim 15, wherein the first optical model, the second optical model, and the third optical model are represented as weighted sums of Zernike polynomials.

* * * * *